US012322697B2

(12) United States Patent
Vanukuru et al.

(10) Patent No.: US 12,322,697 B2
(45) Date of Patent: Jun. 3, 2025

(54) SERIES INDUCTORS

(71) Applicant: GlobalFoundries U.S. Inc., Malta, NY (US)

(72) Inventors: Venkata Narayana Rao Vanukuru, Bangalore (IN); Zhong-Xiang He, Essex Junction, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 18/438,916

(22) Filed: Feb. 12, 2024

(65) Prior Publication Data

US 2024/0186240 A1 Jun. 6, 2024

Related U.S. Application Data

(63) Continuation of application No. 17/343,101, filed on Jun. 9, 2021, now Pat. No. 11,942,423.

(51) Int. Cl.
*H01L 23/522* (2006.01)
*H01F 17/00* (2006.01)
*H01F 41/04* (2006.01)
*H01L 23/528* (2006.01)

(52) U.S. Cl.
CPC ..... *H01L 23/5227* (2013.01); *H01F 17/0013* (2013.01); *H01F 41/041* (2013.01); *H01L 23/5283* (2013.01)

(58) Field of Classification Search
CPC ............. H01L 23/5227; H01L 23/5283; H01F 17/0013; H01F 41/041
See application file for complete search history.

(56) References Cited

U.S. PATENT DOCUMENTS

| | | | |
|---|---|---|---|
| 5,757,623 A | 5/1998 | Fisher et al. |
| 6,187,647 B1 | 2/2001 | Chu |
| 6,292,086 B1 | 9/2001 | Chu |
| 6,326,673 B1 | 12/2001 | Liou |
| 6,342,424 B1 | 1/2002 | Pichler |
| 6,355,535 B2 | 3/2002 | Liou |
| 6,664,882 B2 | 12/2003 | Andoh et al. |
| 6,833,603 B1 | 12/2004 | Park et al. |
| 6,891,462 B2 | 5/2005 | Andoh et al. |
| 7,129,561 B2 | 10/2006 | Coolbaugh et al. |

(Continued)

FOREIGN PATENT DOCUMENTS

DE 102018109099 10/2018

OTHER PUBLICATIONS

German Office Action in related DE Application No. 10 2022 109 713.7, dated May 2, 2023, 10 pages.

(Continued)

*Primary Examiner* — Peniel M Gumedzoe
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to series inductors and methods of manufacture. A structure includes a plurality of wiring levels each of which include a wiring structure connected in series to one another. A second wiring level being located above a first wiring level of the plurality of wiring levels. A wiring structure on the second wiring level being at least partially outside boundaries of the wiring structure of the first wiring level.

19 Claims, 4 Drawing Sheets

(56) References Cited

U.S. PATENT DOCUMENTS

| | | | |
|---|---|---|---|
| 7,400,025 B2* | 7/2008 | Pitts | H01L 28/10 |
| | | | 257/E21.022 |
| 8,232,173 B2 | 7/2012 | Ding et al. | |
| 8,645,898 B2 | 2/2014 | Ding et al. | |
| 8,884,399 B2 | 11/2014 | Cheng et al. | |
| 9,570,233 B2 | 2/2017 | Groves et al. | |
| 10,389,392 B1 | 8/2019 | Kubena et al. | |
| 10,553,353 B2 | 2/2020 | Vanukuru | |
| 10,672,806 B2 | 6/2020 | Paul et al. | |
| 2009/0322446 A1* | 12/2009 | Daley | H01L 23/5223 |
| | | | 257/E21.022 |
| 2012/0188047 A1* | 7/2012 | Groves | H01F 17/0013 |
| | | | 336/200 |
| 2014/0110821 A1* | 4/2014 | Barry | H01L 28/10 |
| | | | 257/E29.325 |
| 2018/0308919 A1 | 10/2018 | Schuberth et al. | |
| 2019/0355676 A1 | 11/2019 | Tu et al. | |
| 2022/0399270 A1 | 12/2022 | Vanukuru et al. | |

OTHER PUBLICATIONS

Venkata Vanukuru, "Millimeter-wave bandpass filter using high-Q conical inductors and MOM capacitors", 2016 IEEE Radio Frequency Integrated Circuits Symposium, 4 pages.

* cited by examiner

SERIES INDUCTORS

FIELD OF THE INVENTION

The present disclosure relates to semiconductor structures and, more particularly, to series inductors and methods of manufacture.

BACKGROUND

An inductor is a passive two-terminal electrical component that stores energy in a magnetic field as electric current flows through its coils. On-chip inductors are passive components in radio frequency (RF)/millimeter wave integrated circuits. The on-chip inductors can eliminate impedance mismatching, minimize reflection and losses, secure required resonance frequencies, and cut AC currents such as high frequency comparisons in power supply lines. Moreover, in RF applications, inductors can reduce proximity effects and parasitic capacitance.

Structural parameters such as the outer dimension, number of turns, distance between the centers of lines (or pitch), and substrate property are all important factors in determining the performance of on-chip inductors. Traditional planar type of inductors, though, fail to conform to current demands of semiconductor devices as they typically occupy a large chip area. Moreover, current handling capability of the inductor increases with width and thickness of the inductor line segments; however, Q factor decreases with width and thickness due to the increased proximity effect. For this and other reasons, high inductance value inductors with high-Q factor are difficult to fabricate on silicon wafers.

It is understood by those of skill in the art that high-Q factor inductors are utilized in many electronic devices, such as TV turners, RF chokes, low noise amplifiers, voltage controlled oscillators, and power amplifiers, etc. The quality factor Q is an important metric as it describes how good an inductor can work as an energy-storage element. In the ideal case, inductance is a pure energy storage element (Q approaches infinity), while in reality coil resistance and parasitic capacitance reduce Q. This is because the coil resistance consumes stored energy, and the parasitic capacitance reduces inductivity (the inductor can even become capacitive at high frequencies).

SUMMARY

In an aspect of the disclosure, a structure comprises a plurality of wiring levels each of which comprise a wiring structure connected in series to one another, a second wiring level being located above a first wiring level of the plurality of wiring levels, and a wiring structure on the second wiring level being at least partially outside boundaries of the wiring structure of the first wiring level.

In an aspect of the disclosure, a structure comprises: a first wiring structure residing on a first wiring level; a second wiring structure residing on a second wiring level and being connected in series to the first wiring structure; and a third wiring structure residing on a third wiring level and being connected in series to the second wiring structure, wherein: the first wiring structure, the second wiring structure and the third wiring structure being a spiral inductor spanning over the first wiring level, the second wiring level and the third wiring level, and the second wiring structure resides at least partially outside a boundary of the first wiring structure and the third wiring structure resides at least partially outside a boundary of the second wiring structure.

In an aspect of the disclosure, a method comprises: forming a first wiring structure residing on a first wiring level; forming a second wiring structure residing on a second wiring level and being connected in series to the first wiring structure; and forming a third wiring structure residing on a third wiring level and being connected in series to the second wiring structure, wherein: the first wiring structure, the second wiring structure and the third wiring structure being formed as a spiral inductor spanning over the first wiring level, the second wiring level and the third wiring level, and the second wiring structure formed at least partially residing outside a boundary of the first wiring structure and the third wiring structure formed at least partially residing outside a boundary of the second wiring structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to series inductors and methods of manufacture. More specifically, the present disclosure relates to high inductance value and high-Q series inductors (or transformers) and a method of making the same using multiple metal lines and via levels, e.g., triple thick metal layers. Advantageously, the present disclosure enables on-chip, high-Q and high inductance value inductors.

In embodiments, the on-chip inductor utilizes three wiring levels of thick metal wiring structures connected in series, which increases the inductance density significantly and reduces chip size and production costs. The wiring levels comprise a stack of three metal layers or wiring structures electrically coupled to one another in series. For example, in embodiments, a multi-layered back end of the line (BEOL) passive device (e.g., inductor and/or transformer) includes a wiring (e.g., metal wiring structure) of the second metal level with no restriction of staying within the boundary (i.e., width of wiring structure) of the first wiring level. Specifically, the wiring levels can be in a spiral configuration of different shapes, e.g., round, octagonal, square, etc., each of which slightly or partially overlap with one another, e.g., an overlap area being less than 5% of the ring area. This is in comparison to known spiral inductors which include two layers coupled together by an interconnect and which are in complete alignment and directly over one another. A via level may also be used to construct a part of the overall spiral by carrying independent current between wiring levels, e.g., between the second and third thick metal material.

The series inductors of the present disclosure can be manufactured in a number of ways using a number of different tools. In general, though, the methodologies and tools are used to form structures with dimensions in the micrometer and nanometer scale. The methodologies, i.e., technologies, employed to manufacture the series inductors of the present disclosure have been adopted from integrated circuit (IC) technology. For example, the structures are built on wafers and are realized in films of material patterned by photolithographic processes on the top of a wafer. In particular, the fabrication of the series inductors uses three basic building blocks: (i) deposition of thin films of material on a substrate, (ii) applying a patterned mask on top of the films by photolithographic imaging, and (iii) etching the films selectively to the mask.

Figure 1:
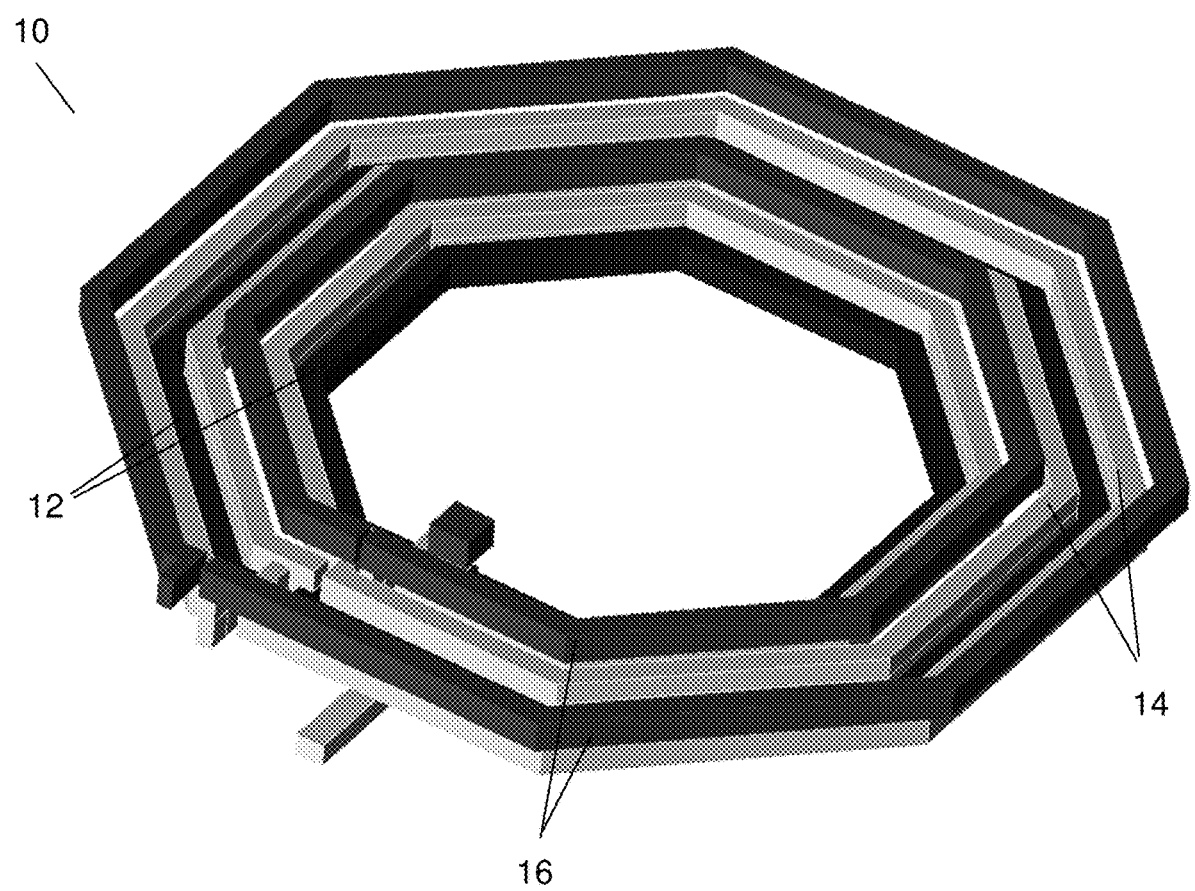
FIG. 1 shows a series inductor with multiple wiring levels in accordance with aspects of the present disclosure.

FIG. 1 shows a series inductor in accordance with aspects of the present disclosure. More specifically, the series inductor 10 includes three wiring levels 12, 14, 16, each of which comprise a metal wiring structure in a spiral configuration extending within the different wiring levels. In embodiments, the metal wiring structures may partially overlap with metal wiring structures in another wiring level. For example, the metal wiring structure in wiring level 12 partially overlaps with the metal wiring structure of wiring level 14 which, in turn, partially overlaps with the metal wiring structure of wiring level 16. As an example, the metal wiring structures of the wiring levels 12, 14, 16 partially overlap one another by about 5% or less. In embodiments, the metal wiring structures of the wiring levels 12, 14, 16 can also be laterally separated. In other words, the wiring structure on a successive wiring level is not bounded within or constrained by the width of a wiring structure in the lower wiring level.

Still referring to FIG. 1, the metal wiring structure of the middle wiring level, e.g., wiring level 14, may be a wiring channel of the inductor in a via level. The metal wiring structure of the middle wiring level, e.g., wiring level 14, may be a connection between the metal wiring structures of the lower wiring level 12 and the upper wiring level 16 to support a vertical current. Moreover, the metal wiring structure of wiring level 14 used as a wiring channel also supports independent lateral current. For example, the metal wiring structure of the middle wiring level, e.g., wiring level 14, may be wired independently of the metal wiring structure of the first wiring level 12, and would not be restricted to or bounded by any other wiring structure on any of the other levels of the inductor. Also, in embodiments, the metal wiring structure of the wiring level 14 may be as long as the wiring structures of the wiring levels 12 and 16.

The metal wiring structures of the wiring levels 12, 14, 16 may be in a spiral configuration such as, e.g., round, octagonal, square, etc., where each ring slightly or partially overlaps with the ring below, e.g., an overlap area being less than 5% of the ring area. In other words, the metal wiring structures of the three wiring levels 12, 14, 16 are not directly in alignment with, constrained by or bounded within the previous wiring layer. Also, as in each of the embodiments, the metal wiring structures of the wiring levels 12, 14, 16 form an inductor which is serially connected together and where each wiring structure carries an independent current. In this way, the metal wiring structures of the wiring levels 12, 14, 16 will be extremely compact (which is important for RF integration schemes), while also providing a high Q factor for the same inductance density. Also, the turns may also include multiple tapered turns as per sheet resistance (e.g., sheet rho).

It should be recognized that although two spirals are shown in each wiring level 12, 14, 16, any number of spirals are contemplated herein. Also, although three wiring levels 12, 14, 16 are shown, it should also be recognized that any number of wiring levels are contemplated herein such as two or more, depending on the desired performance characteristics.

Still referring to FIG. 1, the metal wiring structures of the wiring levels 12, 14, 16 may be any conductive material such as, for example, copper, silver, gold or other low resistance materials or combinations thereof. For example, the metal wiring structures of the wiring levels 12, 14 may be copper, whereas, the metal wiring structure of the wiring level 16 may be aluminum. In this scenario, as described with respect to FIG. 4, a via interconnect may be used to connect the metal wiring structure of wiring level 16 to the metal wiring structure of wiring level 14. In embodiments, the metal wiring structures of each of the wiring levels 12, 14, 16 can have a thickness of approximately 2 μm to 5 μm and a width of approximately 2 μm to 5 μm; although other dimensions are contemplated herein depending on the desired performance parameters.

Figure 2:
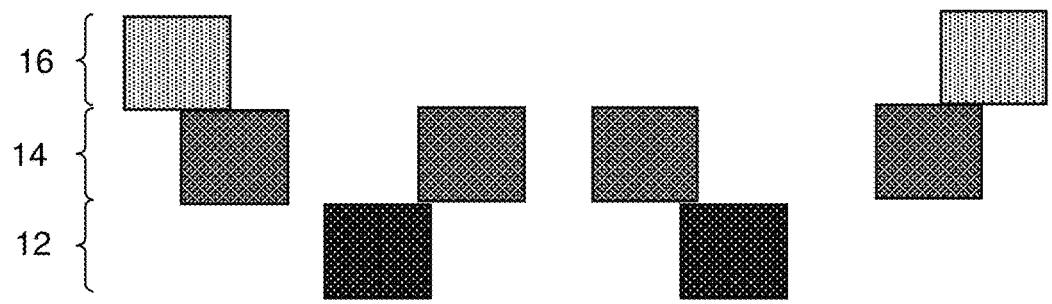
FIG. 2 shows a cross-sectional view of metal wiring structures of each of the wiring levels in accordance with aspects of the present disclosure.

FIG. 2 shows a cross-sectional view of the metal wiring structures of each of the wiring levels 12, 14, 16. For example, as shown in FIG. 2 the metal wiring structures of each of the wiring levels 12, 14, 16 partially overlap with one another. In this scenario, the metal wiring structures of each of the wiring levels 12, 14, 16 can be fabricated without any via interconnects. Alternatively, via interconnects can be used to connect the different metal wiring structures of each of the wiring levels, with the understanding that the metal wiring structures will not be directly aligned with or bounded by any of the other metal wiring structures.

Figure 3:
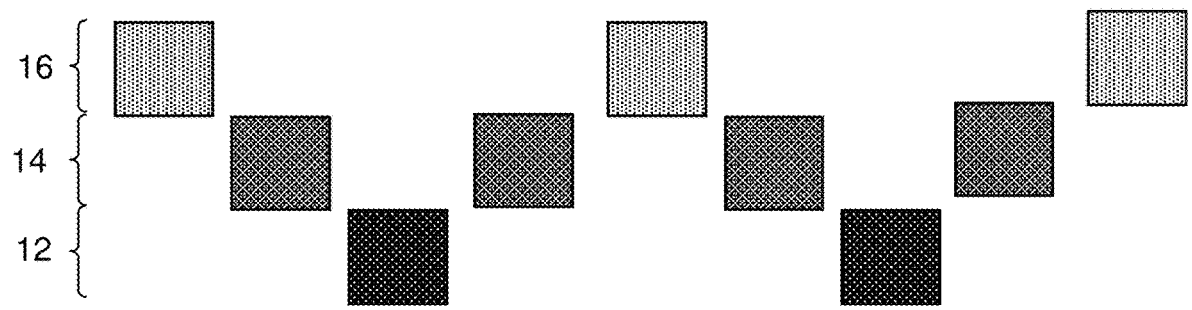
FIG. 3 shows a cross-sectional view of laterally separated metal wiring structures on each of the wiring levels in accordance with aspects of the present disclosure.

FIG. 3 shows a cross-sectional view of the metal wiring structures of each of the wiring levels 12, 14, 16 in accordance with additional aspects of the present disclosure. In FIG. 3, the metal wiring structures of each of the wiring levels 12, 14, 16 may be spaced apart, e.g., laterally separated from one another, in a range from about 1 μm to about 5 μm. It should be recognized that a minimum staggering (e.g., separation) will lead to a high inductance density (high magnetic and electric coupling between the spirals); whereas, an increased staggering will result in a high self resonant frequency (lower magnetic and electric coupling between the spirals). In this configuration, via interconnects can be used to connect the different metal wiring structures of each of the wiring levels.

Figure 4:
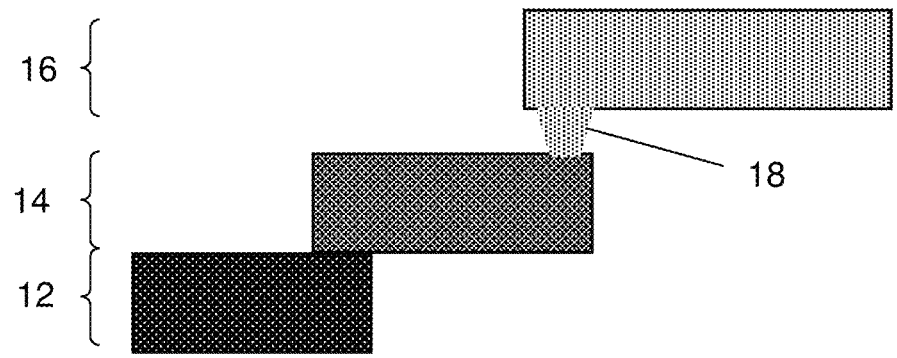
FIG. 4 shows a cross-sectional view of the metal wiring structures with a tapered via interconnect in accordance with additional aspects of the present disclosure.

FIG. 4 shows a cross-sectional view of the metal wiring structures with a tapered via interconnect in accordance with additional aspects of the present disclosure. In FIG. 4, the metal wiring structure of wiring level 16 may be composed of a different material than the metal wiring structures of wiring levels 12, 14. For example, the metal wiring structure of wiring level 16 may be aluminum, whereas, the metal wiring structures of wiring levels 12, 14 may be copper. In this configuration, a tapered via 18 may be used to connect the metal wiring structure of wiring level 16 to the metal wiring structure of wiring layer 14. As seen, though, the metal wiring structure of wiring level 16 may still partially overlaps with the metal wiring structure of wiring level 14.

Figure 5:
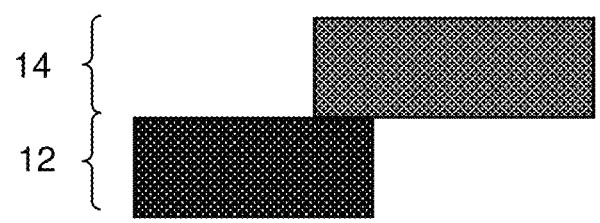
FIG. 5 shows a cross-sectional view of an inductor with two wiring levels in accordance with additional aspects of the present disclosure.

FIG. 5 shows a cross-sectional view of the metal wiring structures in accordance with additional aspects of the present disclosure. In this embodiment, the inductor includes metal wiring structures on two wiring levels 12, 14. As in the other embodiments described herein, the metal wiring structures on the two wiring levels 12, 14 partially overlap within one another.

Figure 6:
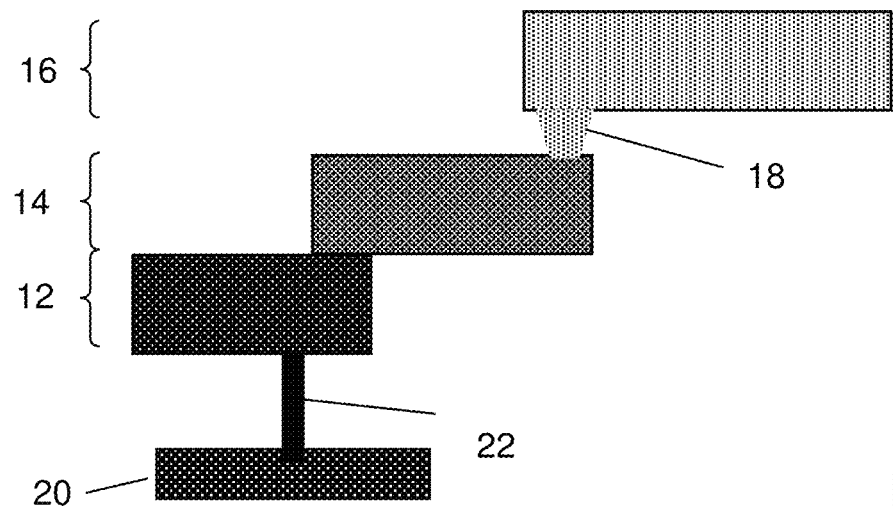
FIG. 6 shows a cross-sectional view of a bottom metal wiring structure of the inductor connected to a wiring structure in accordance with aspects of the present disclosure.

FIG. 6 shows a cross-sectional view of a bottom metal wiring structure of the inductor connected to a wiring structure. More specifically, in FIG. 6, the bottom metal wiring structure, e.g., wiring level 12, may be connected to a wiring structure 20 by an interconnect structure 22. It should be recognized that although FIG. 6 shows the structure of FIG. 4 connected to the wiring structure 20, any of the structures shown in FIGS. 1-5 can comprise the bottom metal wiring structure of the wiring level 12 connected to a wiring structure 20 by the interconnect structure 22.

In embodiments, each of the metal wiring structures of the wiring levels 12, 14, 16, the via interconnects 18, 22 and the wiring structure 20 can be formed by conventional lithography, etching and deposition methods known to those of skill in the art. For example, a resist formed over insulator material is exposed to energy (light) to form a pattern (opening). An etching process with a selective chemistry, e.g., reactive ion etching (RIE), will be used to form one or more trenches in the insulator material through the openings of the resist. The resist can then be removed by a conventional oxygen ashing process or other known stripants. Following the resist removal, the metal material can be deposited by any conventional deposition processes, e.g., chemical vapor deposition (CVD) processes. Any residual material on the surface of the insulator material can be removed by conventional chemical mechanical polishing (CMP) processes. This process can be repeated numerous times for each of the metal wiring structures, interconnects and vias.

Figure 7A:
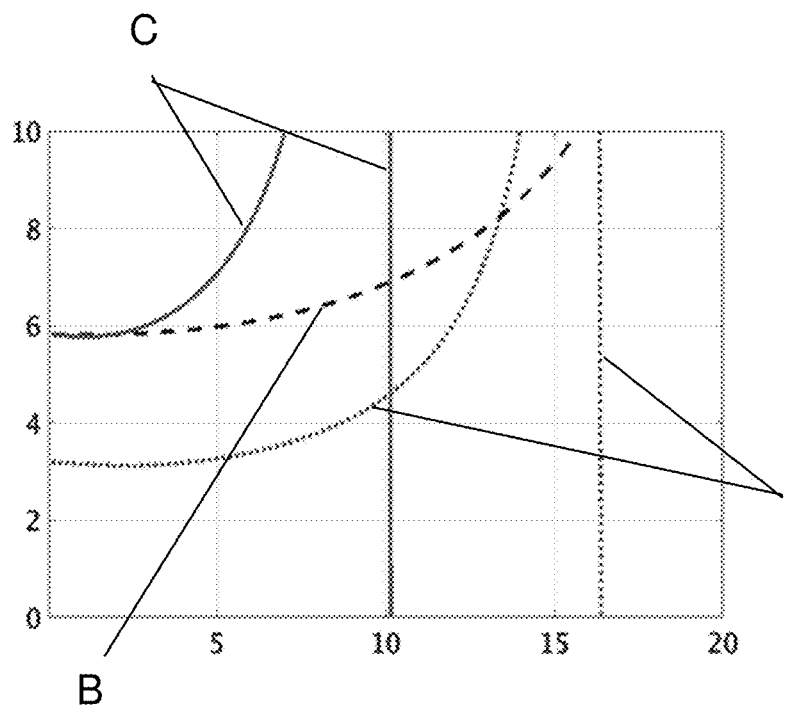
FIGS. 7A and 7B show different performance graphs of known inductors vs. the serial inductor described herein.
Figure 7B:
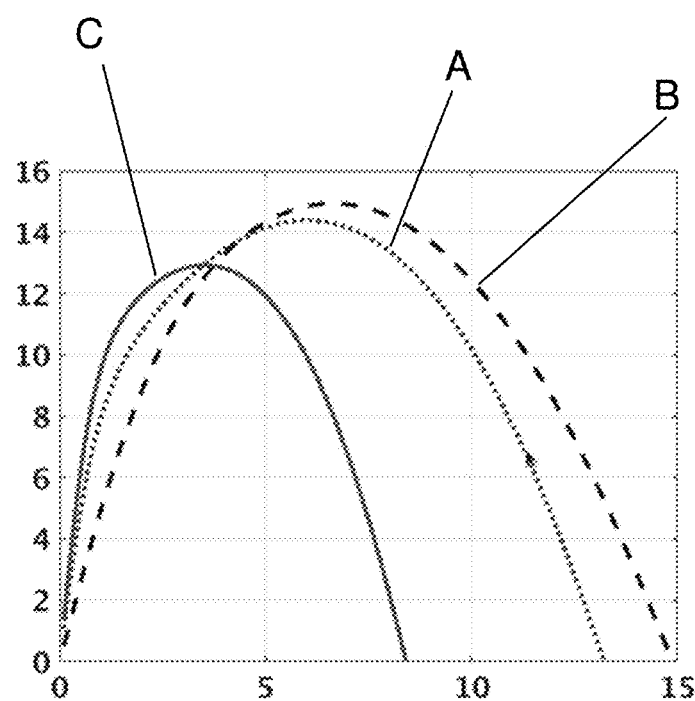

FIGS. 7A and 7B show different performance graphs of known inductors vs. the serial inductor described herein. In particular, FIG. 7A shows a graph of inductance vs. frequency and FIG. 7B shows a graph of Q factor vs. inductance. In FIGS. 7A and 7B, the x-axis represents frequency, whereas, the y-axis in FIG. 7A represents inductance (nH) and the y-axis in FIG. 7B represents Q factor. In both FIGS. 7A and 7B, lines "A" and "C" represent known inductors and line "B" represents an inductor according to the present disclosure. The following table show the characteristics of each of the different inductors.

TABLE

|  | Inductor "A" | Inductor "B" | Inductor "C" |
|---|---|---|---|
| Outside Diameter | 120 μm | 120 μm | 140 μm |
| Inductance L (nH) | 3.2 | 5.8 | 5.8 |
| Qpeak | 14.1 | 17.9 | 12.9 |
| Frequency (GHz) | 6.1 | 6.8 | 3.5 |

As shown from the graph and the above table, the inductor of the present disclosure as represented by line "B provides significant inductor performance over the inductors represented by lines "A" and "C". For example, the inductor of the present disclosure as represented by line "B" has a smaller footprint than the inductor represented by line "C" while providing the same inductance, but at a higher Q factor. In addition, the inductor of present disclosure as represent at line "B" has a same footprint as the inductor of line "A", while providing an improved Q factor at a higher inductance and frequency.

The series inductors can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a plurality of wiring levels each of which comprise a wiring structure, a second wiring level being located above a first wiring level of the plurality of wiring levels, wherein a top portion of a wiring structure of the first wiring level is in direct physical contact with a bottom surface of the wiring structure of the second wiring level with the direct physical contact between the top portion of the wiring structure of the first wiring level and the bottom surface of the wiring structure of the second wiring level being devoid of any via interconnects.

2. The structure of claim 1, wherein the wiring structure of the first wiring level and the wiring structure of the second wiring level form a spiral inductor with the wiring structure of the second wiring level comprising a lateral wiring channel of the inductor.

3. The structure of claim 2, wherein the spiral inductor comprises a ring shape.

4. The structure of claim 1, wherein the wiring structure of the second wiring level partially overlaps the wiring structure on the first wiring level below the second wiring level.

5. The structure of claim 4, wherein the partial overlap comprises about 5% or less of a ring area of the wiring structure of the first wiring level and the wiring structure of the second wiring level.

6. The structure of claim 1, wherein a portion of the wiring structure of the second wiring level resides outside the boundaries of the wiring structure on the first wiring level.

7. The structure of claim 1, wherein the wiring structure of the second wiring level comprises part of a spiral inductor with the wiring structure of the first wiring level, the wiring structures of the first wiring level and the second wiring level independently carries lateral current in the spiral inductor.

8. The structure of claim 1, wherein the second wiring level comprises a via above the first wiring level of the plurality of wiring levels.

9. The structure of claim 1, wherein the plurality of wiring levels include three wiring levels each of which include wiring structures of a spiral inductor, where the second wiring level resides below a third wiring level, and a wiring structure of the third wiring level resides at least partially outside boundaries of the wiring structure of the second wiring level.

10. The structure of claim 9, wherein a portion of the third wiring level resides outside the boundaries of the wiring structure of the second wiring level.

11. The structure of claim 9, wherein the wiring structure of the first wiring level and the second wiring level comprise a first conductive material and the wiring structure of the third wiring level comprises a second conductive material different than the first conductive material.

12. The structure of claim 9, further comprising a tapered via interconnect connecting the wiring structure of the second wiring level to the wiring structure of the third wiring level.

13. A structure comprising:
a first wiring structure residing on a first wiring level;
a second wiring structure residing on a second wiring level and being connected in series to the first wiring structure; and
a third wiring structure residing on a third wiring level and being connected in series to the second wiring structure, wherein:
the first wiring structure, the second wiring structure and the third wiring structure comprise a spiral inductor and at least the second wiring structure overlaps the first wiring structure, with a portion of the second wiring structure outside lateral boundaries of the first wiring structure, and a portion of the third wiring structure being outside of lateral boundaries of the second wiring structure, in a plan view, and
wherein the overlap area is less than 5% a ring area of the first wiring structure, a top surface of the first wiring structure directly contacts a bottom surface of the second wiring structure and the third wiring structure is connected to the second wiring structure by a tapered via structure.

14. The structure of claim 13, wherein the second wiring structure resides at least partially outside a boundary of the first wiring structure and the third wiring structure resides at least partially outside a boundary of the second wiring structure.

15. The structure of claim 13, wherein the second wiring structure comprises a wiring structure which independently carries a lateral current.

16. The structure of claim 13, wherein the second wiring structure carries a vertical current between the first wiring structure and the second wiring structure.

17. The structure of claim 13, wherein the first wiring structure and the second wiring structure comprise a first material and the third wiring structure comprises a second material and the first wiring structure of the spiral inductor is connected to a bottom wiring layer by a tapered via interconnect.

18. The structure of claim 13, further comprising a tapered via interconnect connecting the second wiring structure to the third wiring structure.

19. A method comprising:
forming a plurality of wiring levels each of which comprise a wiring structure; and
forming a second wiring level being located above a first wiring level of the plurality of wiring levels,
wherein a top portion of a wiring structure of the first wiring level is in direct physical contact with a bottom surface of the wiring structure of the second wiring level with the direct physical contact between the top portion of the wiring structure of the first wiring level and the bottom surface of the wiring structure of the second wiring level being devoid of any via interconnects.

* * * * *